United States Patent [19]

Higashino et al.

[11] Patent Number: 5,481,119
[45] Date of Patent: Jan. 2, 1996

[54] SUPERCONDUCTING WEAK-LINK BRIDGE

[75] Inventors: Hidetaka Higashino, Matsubara; Koichi Mizuno, Nara; Kentaro Setsune, Sakai, all of Japan

[73] Assignee: Matsushita Electric Industrial Co., Ltd., Osaka, Japan

[21] Appl. No.: 926,020

[22] Filed: Aug. 7, 1992

Related U.S. Application Data

[63] Continuation of Ser. No. 733,018, Jul. 19, 1991, abandoned, which is a continuation of Ser. No. 522,927, May 14, 1990, abandoned.

[30] Foreign Application Priority Data

May 12, 1989 [JP] Japan ................... 1-118944

[51] Int. Cl.⁶ ................................................. H01L 39/22
[52] U.S. Cl. ............................ 257/34; 257/36; 505/190
[58] Field of Search ............................ 357/5, 4; 505/1, 505/190; 257/34, 36, 33

[56] References Cited

U.S. PATENT DOCUMENTS

| | | |
|---|---|---|
| 4,157,555 | 6/1979 | Gray . |
| 4,334,158 | 6/1982 | Faris ............................................. 357/5 |
| 4,837,609 | 6/1989 | Gurvitch et al. ............................ 357/5 |
| 5,071,832 | 12/1991 | Iwamatsu ..................................... 357/4 |
| 5,075,736 | 12/1991 | Wada ............................................ 357/4 |

FOREIGN PATENT DOCUMENTS 57-76890  5/1982  Japan .

OTHER PUBLICATIONS

Soerensen et al., "Microstrip Coupling Techniques Applied to Thin–Film Josephson Junctions at Microwave Frequencies", *IEEE Trans. on MAG.*, vol. Mag 17(1), Jan. 1981, pp. 107–110.

Ito et al., "Highly Sensitive Photodetection using a Microwave–coupled BaPbBiO Josephson Junction Array", *Appl. Phys. Lett.*, vol. 43(3), Aug. 1, 1983, pp. 314–316.

Laibowitz et al., "Thin Superconducting Oxide Films", *Phys. Rev. B*, vol. 35(16), Jun. 1, 1987, pp. 8821–8823.

Clarke, "Small Scale Analog Applications of High–$T_c$ Temp. Superconductory", *Nature*, vol. 333(5), May 1988, pp. 29–35.

Bernhoff et al., "Molecular Beam Epitaxy Deposited Thin Films of Bismuth Compound Superconductors", Appl. Phys. Lett., vol. 57(7), Aug. 13, 1990, pp. 712–714.

Jack et al., "Submicron Tunnel Junctions", IEEE Transactions on Magnetics, vol. MAG–17, No. 1 (Jan. 1981), pp. 295–298.

Kobayashi et al., "Cross–shaped Proximity–Effect Bridge", Appl. Phys. Lett., vol. 34, No. 10, 15 May 1979, pp. 707–708.

Moreland et al., "Evidence for the Superconducting Proximity Effect in Junctions Between the Surfaces of $YBa_2Cu_3O_x$ Thin Films", Appl. Phys. Lett., vol. 54, No. 15, 10 Apr. 1989, pp. 1477–1479.

Eleckrie, vol. 42, No. 6, 1988, p. 229, Berlin, DE; "Leistungfahiges Josephson–Element auf Keramikbasis".

IBM Technical Disclosure Bulletin, vol. 27, No. 10A, Mar. 1985, pp. 5671–5672, New York, US; "Josephson microbridge with improved heat sink".

(List continued on next page.)

*Primary Examiner*—Sara W. Crane
*Assistant Examiner*—Courtney A. Bowers
*Attorney, Agent, or Firm*—Wenderoth, Lind & Ponack

[57] ABSTRACT

A superconducting element includes a superconducting thin film bridge extending along the surface of a substrate, and a control electrode member for injecting quasi particles into a portion of an intersection region of the superconducting thin film bridge. The intersection region extends across the superconducting thin film bridge in a direction which is perpendicular to the current flow direction of the superconducting thin film bridge. A remaining portion of the intersection region, which is not injected with quasi particles by the control electrode member, operates as a weak-coupling bridge to thereby control the current flow within the superconducting thin film bridge.

11 Claims, 10 Drawing Sheets

OTHER PUBLICATIONS

IEEE Transactions on Magnetics, vol. 25, No. 2, Mar. 1989, pp. 927–930, New York, US; T. Kobayashi et al.: "Three terminal YBaCuO Josephson device with quasi–particle injection gate".

Japanese Journal of Applied Physics, vol. 21, suppl. 1, 1982, pp. 331–336, Tokyo, JP; S. Sakai et al.: "Quasiparticle–injected superconducting weak link device".

Three–Therminal Superconducting Device by Using Voltage–Induced Modulation; Extended Abstracts of 1987 International Superconductivity Electronics Conference (ISEC '87), Aug. 28–29, 1987; Tokyo, Japan, Katsuhito Fukuoka et al.

Three Terminal YBaCuO Josephson Device with Quasi–Particle Injection Gate, IEEE Transactions on Magnetics, vol. 25, No. 2, Mar. 1989, Takeshi Kobayashi et al.

SUPERCONDUCTING WEAK-LINK BRIDGE

This application is a continuation of now abandoned application Ser. No. 07/733,018, filed Jul. 19, 1991 which is a continuation of abandoned application Ser. No. 07/522,927, filed May 14, 1990.

BACKGROUND OF THE INVENTION

1. Field of the Invention

The present invention relates to a superconducting device which can control the critical current and a manufacturing method thereof.

2. Prior Art

Superconducting materials are available for manufacturing a superconducting device which can control the critical current.

Such materials were limited for a long time to those cooled by high cost liquid helium (boiling point 4.2° K.), which is difficult handle. For example, such materials include metals such as lead and niobium, metallic compounds such as NbN, $Nb_3Ge$ and Chevrel compounds, and metallic oxide such as Ba—Pb—Bi—O (BPBO) and Ba—K—Bi—O (BKBO). On the other hand, some oxide superconductors, including copper oxides, have recently been discovered to have a high $T_c$ above 100° K., and they become superconducting when using the relatively low cost liquid nitrogen (boiling point 77.3° K.) as a coolant. Thus, superconducting devices operated at liquid nitrogen temperatures are now available, and the application of such superconducting devices is accordingly expanded.

A superconducting triode, which is one of the superconducting devices which can control the superconducting current, includes a narrow strip of a superconducting thin film made of, for example, a metallic superconducting material Nb, and a metallic electrode arranged substantially perpendicular to the narrow strip and making contact with the thin film on an entire surface of a crossing or overlapping region of the thin film. The superconducting triode controls the superconducting current by injecting quasiparticles into the superconducting thin film from the metallic electrode to form a nonequilibrium superconducting region, the superconducting state in the overlapped region is weakened.

However, the prior art superconducting triode cannot control the width of the superconducting current path even though it can control the superconducting current by the injection of quasiparticles into the overlapped region of the thin film. Thus, if the width of the superconducting current path is much larger than the coherence length, a superconducting triode cannot operate as a weak-coupling bridge and thus the AC Josephson effect cannot be observed.

Further, if a high-$T_c$ oxide superconductor is used for a superconducting triode, the mechanism which causes the superconductivity has not yet been made clear, and the nonequilibrium superconducting state of such a superconductor has not been understood up to now because it depends strongly on the superconducting material.

Still further, a high-$T_c$ oxide superconductor suffer from drawbacks in that it partially dissolves due to the moisture in the air, and in that a solution, an acidic solvent or a basic solvent used in the manufacturing process may leave the superconductivity and damage the superconductor itself. That is, the surface of the thin film of the oxide superconductor is deteriorated during an improper manufacturing process, whereby the resistance value of the junction increases, thus deteriorating the superconducting properties and lowering the yield rate of the triode. For example, an oxide superconductor which includes copper cannot use a ziazo positive-type photoresist having an organic alkaline solution as a developer. Accordingly lift-off process which makes use of a ziazo positive-type photoresist cannot be adopted in the manufacturing processes of such a superconductor. Particularly, an oxide superconductor which includes yttrium is liable to suffer from oxygen damage whereby the superconducting properties become unstable by applying a metallic layer, and additionally the secular change of the superconducting properties is large.

SUMMARY OF THE INVENTION

An object of the present invention is to provide a superconducting element which can control the superconducting current and which has good and stable characteristics.

Another object of the present invention is to provide a method of easily manufacturing such a superconducting element.

A superconducting element according to the present invention includes (a) a superconducting thin film bridge applied to a substrate, and (b) at least one control electrode made of metallic or semiconducting thin film, an end portion of the control electrode being applied to the bridge so that a part of the bridge at the intersection with the control electrode does not contact the control electrode such a part of the bridge being sufficiently narrow to operate as a weak-coupling bridge.

Preferably, a superconducting element according to the present invention has two control electrodes which are applied to the bridge and are separately located from each other in a direction perpendicular to the axis of the flow of the superconducting current.

The material of the superconducting thin film is a metal such as niobium or lead, an alloy or a compound. The material can also be a high-$T_c$ oxide superconductor such as an oxide superconductor containing copper (for example, Bi—Sr—Ca—Cu—O), Ba—Pb—Bi—O or Ba—K—Bi—O.

Further, a control electrode which is at least partially made to directly contact the high-$T_c$ oxide superconductor is preferably made of a metal such as aluminum.

A first superconducting element manufacturing method according to the present invention, the element having a superconducting thin film made of a high-$T_c$ oxide superconductor, includes the steps of (a) forming a bridge made of a thin film of oxide superconductor or of both a thin film of oxide superconductor and an insulating film, (b) applying a resin thin film having resistance to a developing solution of a photoresist to the bridge, (c) applying the photoresist to the resin thin film, (d) removing a part of the photoresist in correspondence with a control electrode, to be formed in a later process, by the exposition and the deposition of the photoresist, (e) removing the exposed resin thin film by exposing it to oxygen plasma, (f) depositing a metallic or semiconducting thin film onto the substrate, and (g) conducting the lift-off of the remaining resin and metallic thin film to form control electrodes.

A second manufacturing method according to the present invention for forming a superconducting element having a superconducting thin film made of a high-$T_c$ oxide superconductor, includes the steps of (a) depositing a thin film of an oxide superconductor, (b) depositing a metallic or semiconducting thin film on the thin film of the oxide superconductor in the same vacuum chamber without disrupting the vacuum, (c) forming a bridge of the layered structure bridge of the the oxide superconductor thin film and the metal or semiconductor thin film using an ion etching technique with inert gas, (d) forming a control electrode according to the patterning of the metallic or semiconducting thin film in the bridge, (e) depositing a metallic or semiconducting thin film onto the substrate, and (f) forming an extension electrode in contact with the control electrode according to the patterning.

BRIEF DESCRIPTION OF THE DRAWINGS

Other objects and advantages of the present invention will be apparent form the following description, the appending claims and the accompanying drawings in which:

DETAILED DESCRIPTION OF THE INVENTION

A superconducting element according to the present invention includes a portion of the overlap region of the bridge which does not make contact with the control electrode. Thus, when quasiparticles are injected from the control electrode, the superconducting carriers in the superconducting bridge are destroyed partially so that not only is the current value controlled, but the superconducting current path is also narrowed to realize a weak-coupling superconducting bridge.

Various embodiments of a superconducting element will be explained below.

Figure 1:
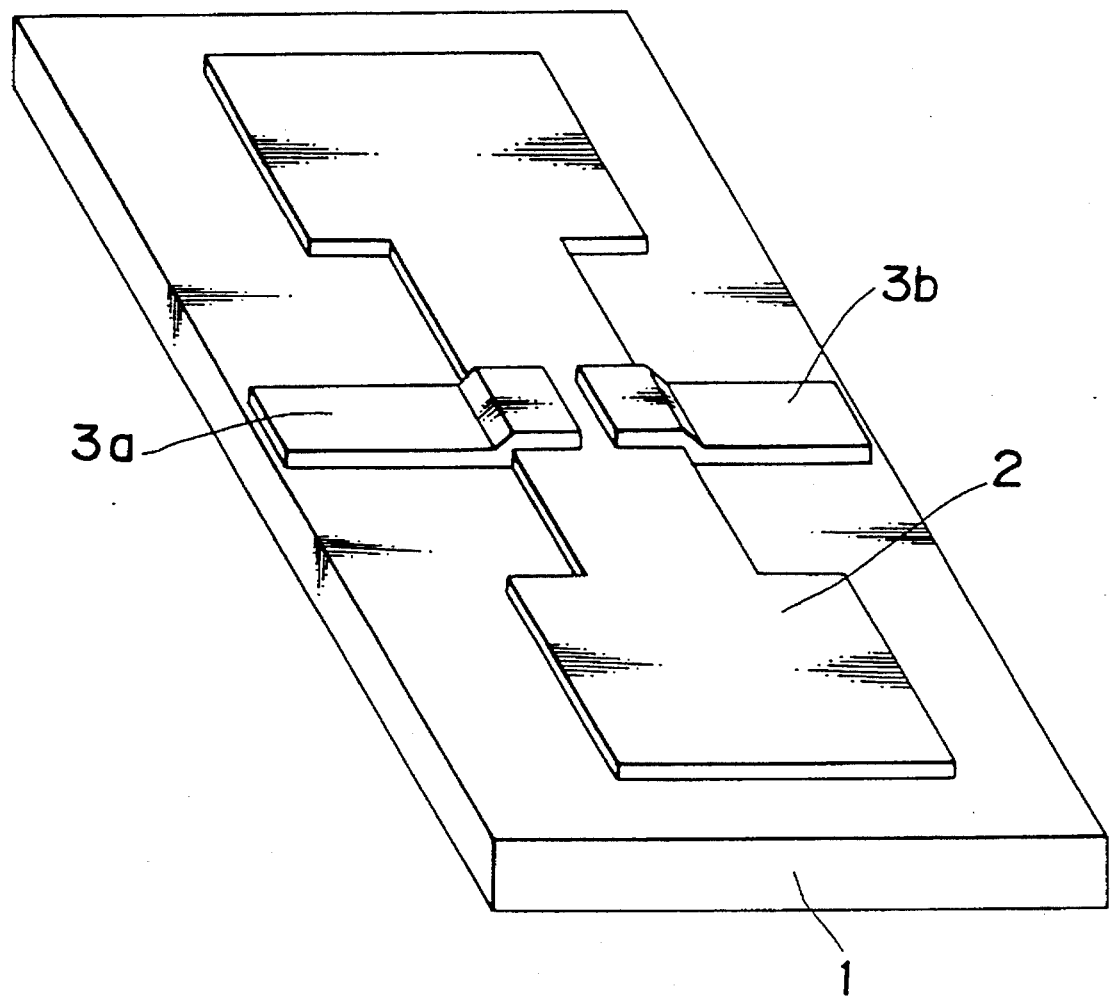
FIGS. 1, 3 and 5 are schematic perspective views of various embodiments of a superconducting element according to the present invention.
Figure 2:
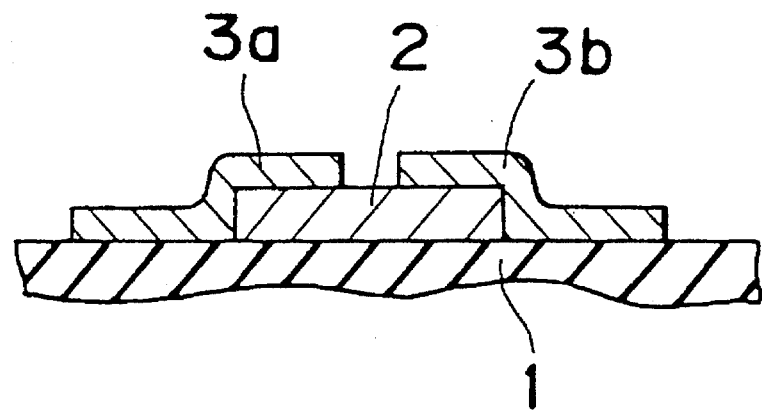
FIGS. 2, 4 and 6 are schematic sectional views of various embodiments of a superconducting element according to the present invention in a direction along which the superconducting current flows.
Figure 4:
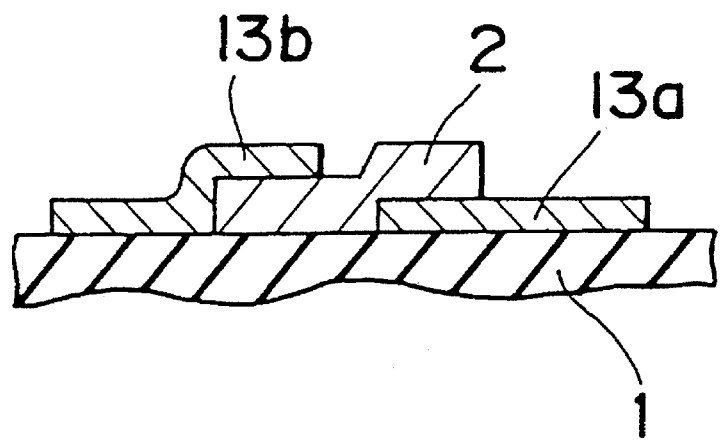
Figure 6:
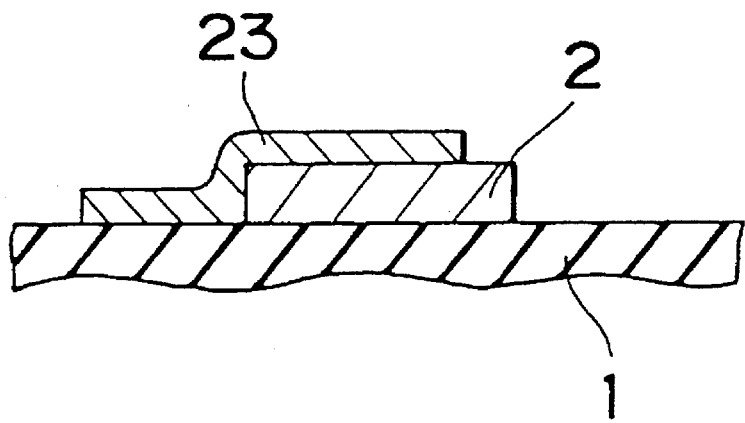
Figure 3:
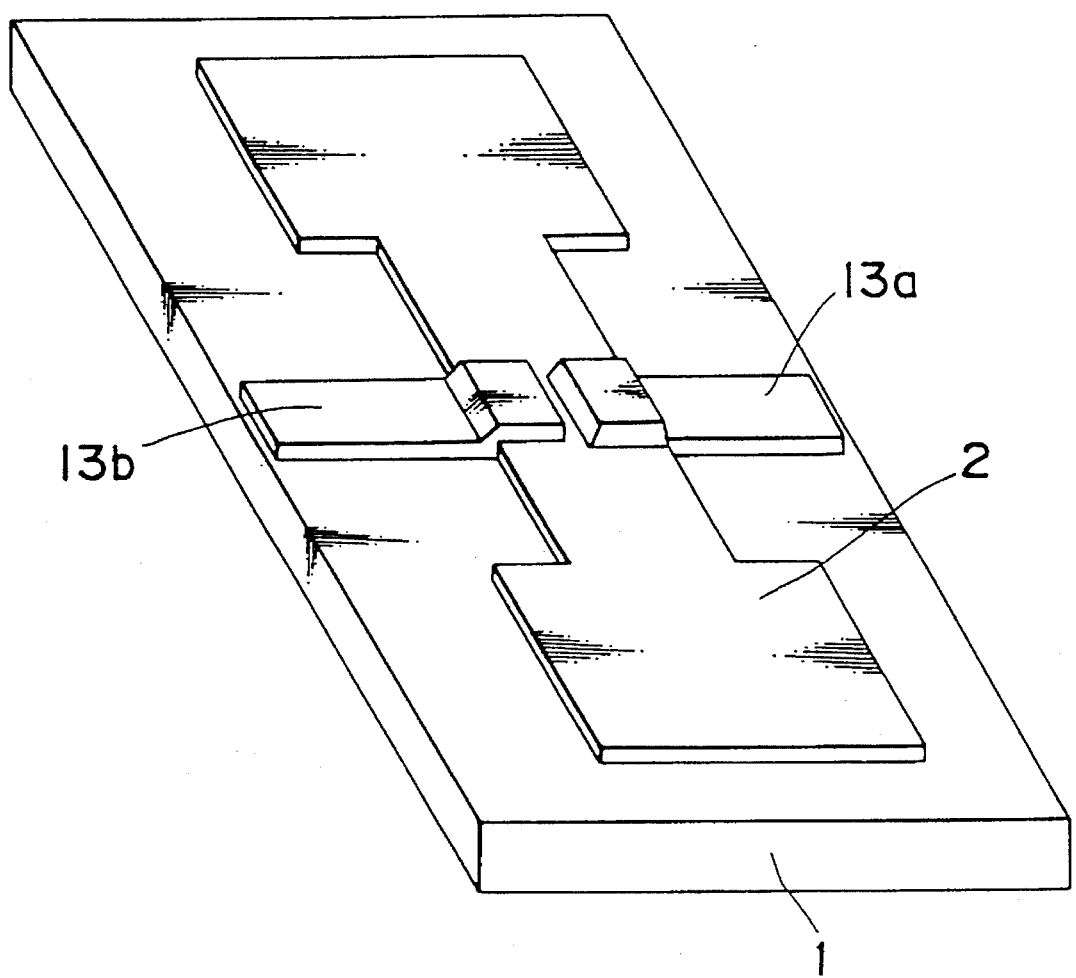
Figure 5:
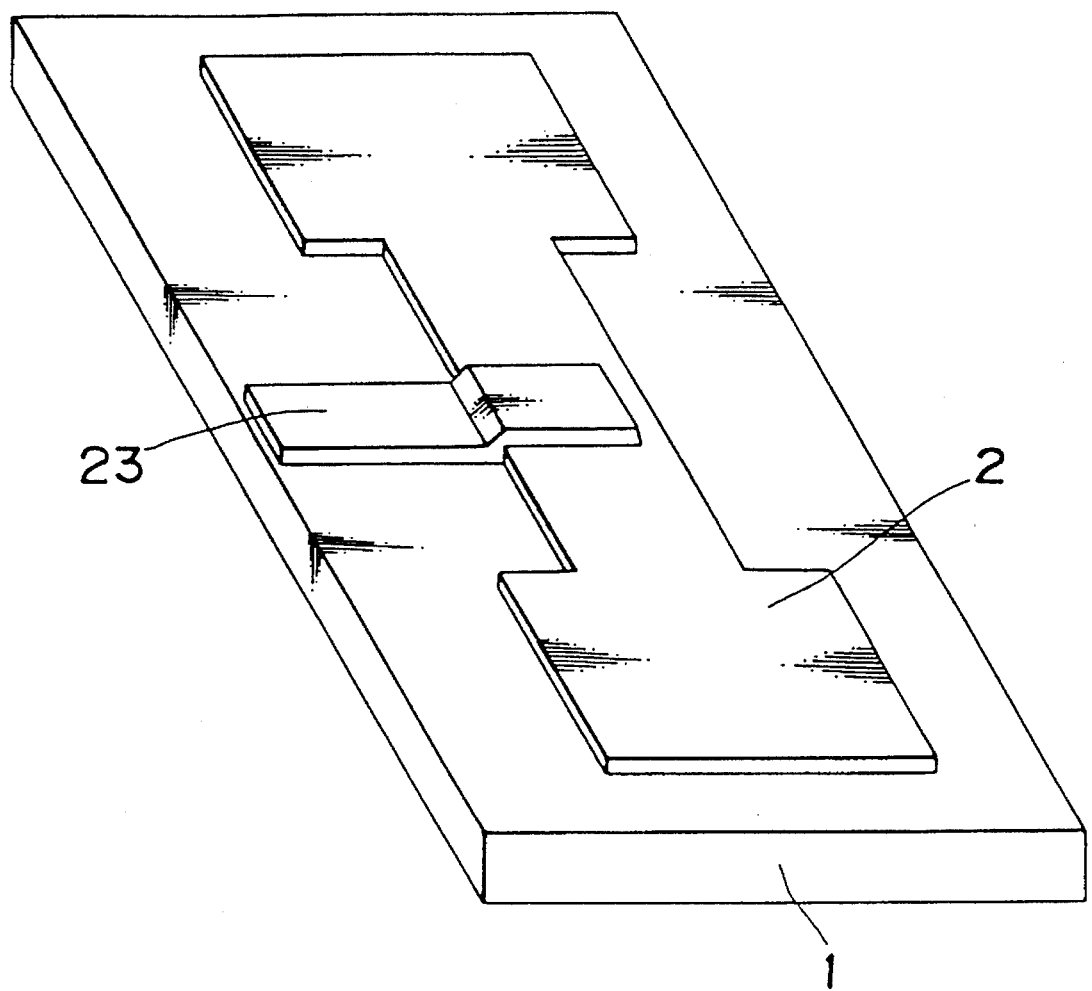

FIGS. 1, 3 and 5 are schematic perspective views of embodiments of a superconducting element according to the present invention, and FIGS. 2, 4 and 6 are schematic sectional views of various embodiments of the superconducting elements in a direction along which the superconducting current flows.

In the superconducting element shown in FIGS. 1 and 2, a bridge of a superconducting thin film 2 is formed on a substrate 1, and includes terminals located at both ends for connecting the bridge to an external current supply (not shown). Two control electrodes 3a and 3b are aligned in a direction perpendicular to the superconducting thin film bridge 2. An end portion of each of the two control electrodes 3a, 3b is applied to the bridge and is spaced from that of the other of each of the two electrodes 3a, 3b on the thin film 2. In other words, the two control electrodes 3a, 3b do not cover the entire intersection region on the superconducting thin film 2 in a direction perpendicular to that of the superconducting current flowing in the thin film 2.

FIG. 2 shows the crosssection of this element in a direction along the control electrodes 3a and 3b.

Insulating films may be inserted at the interface between the thin film 2 and the control electrodes 3a, 3b, if necessary.

In this element the superconducting current flows between the two terminals, while quasiparticles (normal current) are injected from the control electrodes 3a and 3b in to the superconducting thin film 2 at the intersection so as to control the superconducting current path. The control electrode 3a and 3b are separated from each other so that quasiparticles are not injected into the portion of the intersection region of the superconducting thin film 2 which does not overlap the control electrodes 3a, 3b. The injected quasiparticles diffuse in the superconducting thin film 2 to partially destroy the superconductivity, thereby to forming a non-equilibrium state. Thus, the superconducting current path is so narrowed in the intersection region, whereby a weak-coupling bridge is formed between the two portions of the thin film 2 separated by a boundary of the electrodes 3a, 3b.

In a modified embodiment shown in FIGS. 3 and 4, a bridge of superconducting thin film 2 is applied to a control electrode 13a formed on a substrate 1, and another control electrode 13b is applied to a top surface of the superconducting thin film 2, while there remains an region not covered by the control electrodes 13a and 13b in the intersection between the bridge 2 and the control electrodes 13a, 13b in a direction perpendicular to that of the superconducting current. Quasiparticles are injected from both control electrodes 13a, 13b into the superconducting thin film 2 so as to control the superconducting current path, whereas they are not injected into the region of the intersection not covered by the control electrodes 13a, 13b.

In a further embodiment shown in FIGS. 5 and 6, a control electrode 23 is formed to cover the intersection region of superconducting thin film bridge 2 except a narrow portion of the surface in the intersection region in a direction which almost perpendicular to the direction of the superconducting current. In this case, the control current flows between the control electrode 23 and the superconducting thin film 2 to inject quasiparticles into the superconducting thin film 2. Quasiparticles are not injected in the narrow portion of the intersection region which is not covered by the control electrode 23.

The two structures shown in FIGS. 3–6 have essentially the same effect in that a weak-coupling superconducting junction is formed by the injection of quasiparticles from the control electrodes 13a, 13b, 23. Insulating films may be disposed between the superconducting thin film 2 and control electrodes 13a, 13b, 23, as well as in case of the superconducting element shown in FIGS. 1 and 2.

Figure 7:
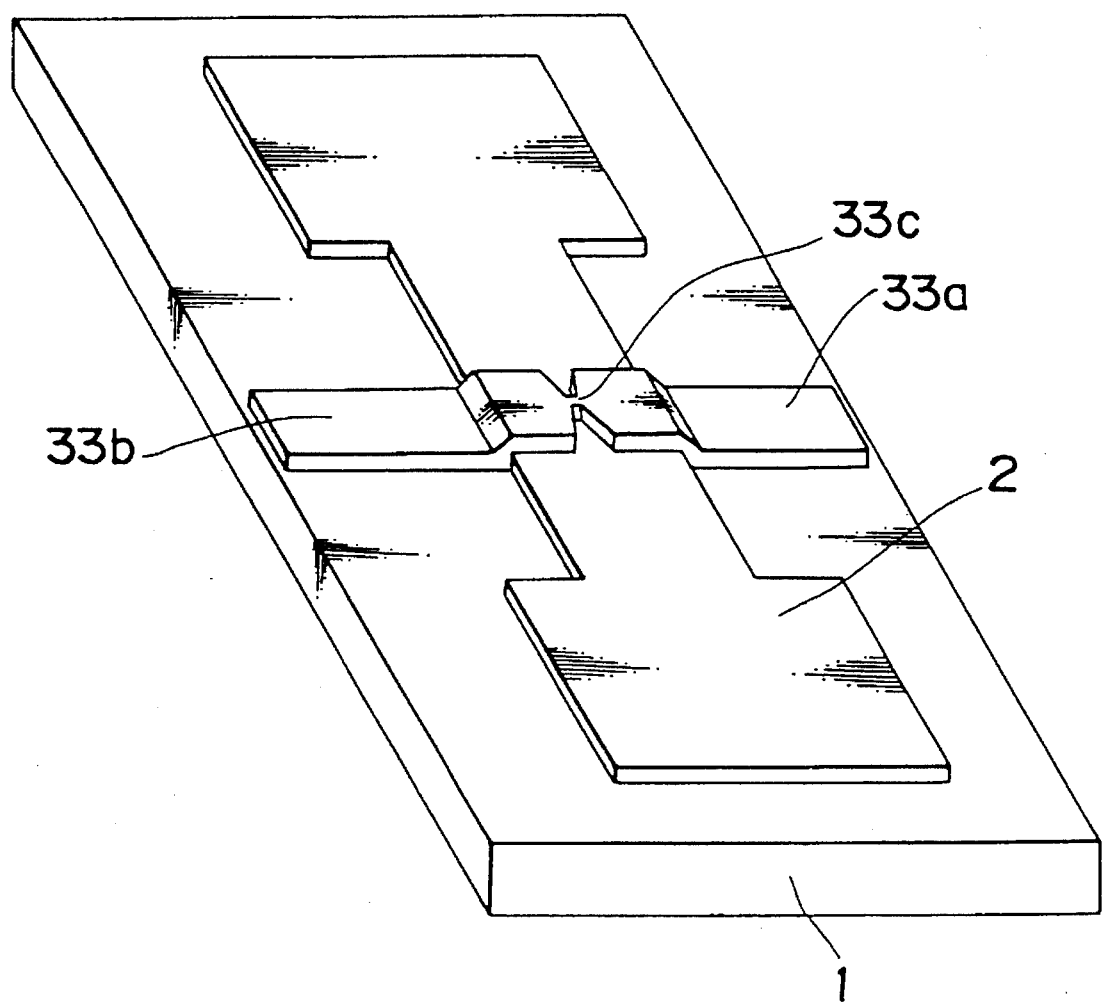
FIG. 7 is a schematic perspective view of a modified embodiment of a superconducting element according to the present invention.

FIG. 7 shows a modified embodiment of a superconducting element according to the present invention. Two control electrodes 33a and 33b are applied to the superconducting thin film bridge 2, and are connected to each other at a connecting region 33c to each other. The width of the control electrodes in connecting region 33c measured in a direction along the superconducting current flow is narrower than that of the two control electrodes 33a, 33b and is at a minimum at the connecting region 33c. In this structure of the superconducting element, the density of the injected quasiparticles is continuous in a direction perpendicular to the axis of the superconducting current within the bridge, and the density becomes a minimum at the connecting region 33c due to diffusion. Therefore, the density distribution of superconducting carriers of the bridge of superconducting thin film 2 becomes a maximum at the connecting region 33c in the direction perpendicular to the axis of the current flow, while it becomes minimum in the direction parallel to the axis of the current flow, whereby a weak-coupling type superconducting bridge is realized. If the width of the connecting region 33c is sufficiently narrow, the superconducting element has characteristics similar to those of the above-mentioned three superconducting elements.

Figure 8A:
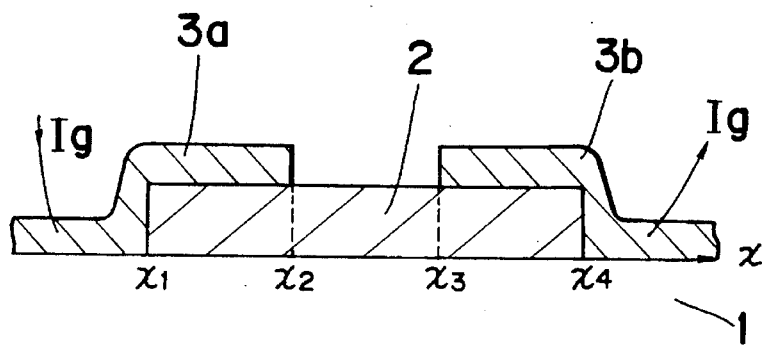
FIG. 8(a) is a schematic sectional view of a superconducting element according to the present invention in a direction along which the superconducting current flows.

The operation of the superconducting elements mentioned above will be explained with reference to FIGS. 8(a)– 8(c). First, the superconducting element is explained using the Bardeen-Cooper-Schrieffer theory. FIG. 8(a) shows a section view of a superconducting element in a direction perpendicular to the superconducting current path, where x denotes a distance along the perpendicular direction. The superconducting thin film 2 is covered by the control electrodes 3a and 3b in the areas between $x_1$ and $x_2$ and between $x_3$ and $x_4$, and is not covered in the area between $x_2$ and $x_3$.

Figure 8B:
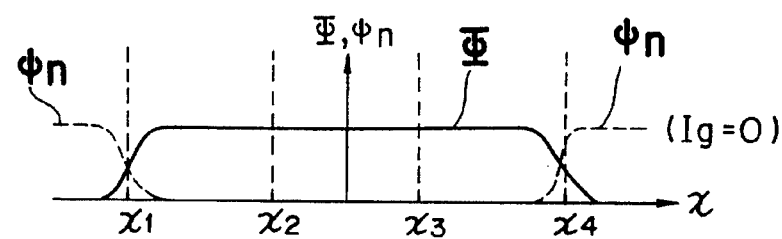
FIG. 8(b) and FIG. 8(c) are graphs of the superconducting order parameter $\Psi$ and the wave function $\Psi_n$ of quasiparticles when the control current $I_g$ does not flow and when the control current $I_g$ does flow between the control electrodes 3a and 3b, respectively.
Figure 8C:
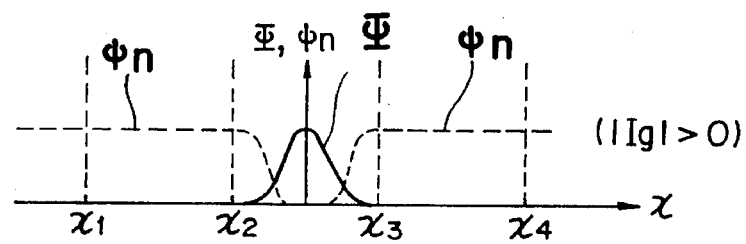

FIGS. 8(b) and 8(c) show the superconducting order parameter $\Psi$ and the quasiparticle wave function $\Psi_n$ when the control current $I_g$ does not flow and when it does flow between the control electrodes 3a and 3b, respectively. In the case of FIG. 8(b), the superconducting order parameter $\Psi$ extends in the superconducting thin film 2 except at the outer boundaries of $x_1$ and $x_4$ which interface ends of superconducting thin film 2 and the control electrodes 3a, 3b.

It is found that the superconducting current flows in the superconducting thin film almost homogeneously because $|\Psi|^2$ corresponds to the carrier density of the superconducting current. On the other hand, in the case of FIG. 8(c) where the control current $I_g$ does flow, quasiparticles which consist of electrons and holes are injected and the superconducting state is partially destroyed to create nonequilibrium superconducting regions. In other words, the quasiparticle wave function $\Psi_n$ extends into the region between $x_1$ and $x_2$ and of $x_3$ $_{and\ x4}$, while the superconducting order parameter $\Psi$ is restricted in a region between $x_2$ and $x_3$.

As the amount of the injected quasiparticles increases, the extension of the superconducting order parameter $\Psi$ becomes narrower. The width of the superconducting current path can be narrowed to form a weak-coupling bridge by increasing the control current since it is of the order of the superconducting order parameter $|\Psi|^2$.

for. As to the high-$T_c$ oxide superconductor, the above-mentioned operation due to the nonequilibrium superconducting phenomena has not yet been made clear. However, some experiments by the inventors on superconducting elements using the high-$T_c$ oxide superconductor show that the characteristics of such elements can also be explained by the above-mentioned operation.

In the structures where insulators are located between the superconducting thin film 2 and the control electrodes 3a, 3b, 13a, 13b, 23, the tunnel junction thus formed can increase the applied voltage therebetween so that a more effective control is possible by increasing the quasi-particle energy of the injecting control current.

On the other hand, when a high-$T_c$ oxide superconductor is used for the material of the superconducting thin film 2 and a metal such as aluminum is used for the material of the control electrode 3a, 3b, 13a, 13b, 23, and when the control electrode is applied to make contact with a side of the high-$T_c$ oxide superconductor, characteristics result which are similar to those of the above-mentioned structures having the insulator films. This is ascribable to the aluminum atoms which are likely to obtain oxygen atoms from the high-$T_c$ oxide superconductor to form an insulating oxide at the interface therebetween.

As explained above, a superconducting element according to the embodiments can control the superconducting current value quickly in response to the current injected by the control electrodes. Further, this superconducting element can be used as a modulation element with a current signal input, and it can act as a bi-directional amplification element or a switching element similar to a transistor. Further, it can act as a weak-coupling Josephson element which can change the critical current by controlling the control current. Thus, it can be used for a superconducting quantum interference detector whose characteristics can be controlled. Still further, it can be used for a detector or a mixer of microwaves, miliwaves, far infrared rays or infrared rays whose characteristics can be controlled.

Thus, a superconductor according to the present invention has large practical advantages in the area of components, electronic instruments and metering devices.

An embodiment of a method of manufacturing a superconducting element mentioned above will be explained below with reference to FIGS. 9(a)–9(e).

Figure 9A:
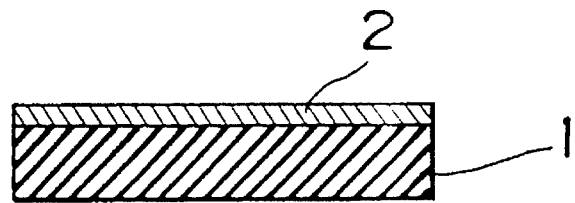
FIGS. 9(a), 9(b), 9(c), 9(d) and 9(e) are schematic sectional views which show successive steps of a method of manufacturing a superconducting element according to the present invention.

As shown in FIG. 9(a), a 200 nm thick superconducting thin film 2 of Bi—Sr—Ca—Cu—O superconductor is formed on a (100) substrate surface of MgO single crystal 1 a using rf planer magnetron sputtering process and heating at 670° C. in argon-$O_2$ environment at 5 mTorr. Then, the thin film 2 is subjected to heat treatment at 845° C. for ten hours in an $O_2$ environment at one atmospheric pressure. The superconducting transition temperature $T_c$ of the thin film 2 is 86° K.

Figure 9B:
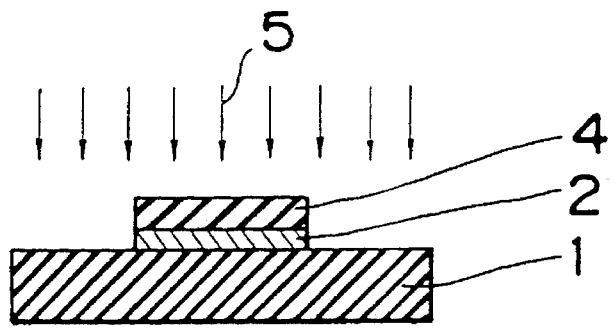

Then, as shown in FIG. 9(b), the superconducting thin film 2 is patterned using a negative-type photoresist 4 and is etched by ion milling using argon ions 5. The remaining photoresist 4 is removed next. Thus, a bridge of superconducting film 2 is formed on the substrate 1, and the width of the superconducting film 2 which will overlap the control electrodes is about 10 μm.

Figure 9C:
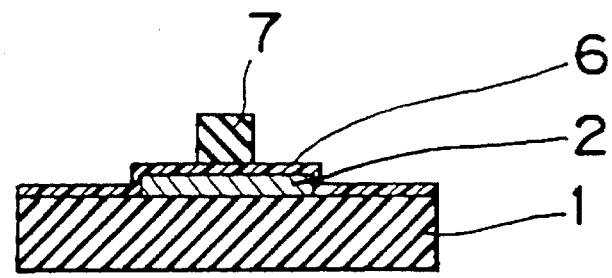

Next, as shown in FIG. 9(c), a 70 nm thick negative type photoresist nm is applied to the superconducting thin film 2 and the substrate 1 as a resin thin film 6 which has resistance to organic alkaline solution. Further, a 800 nm thick positive-type photoresist 7 is applied to the resin thin film 6. Then, some regions of the positive-type photoresist 7 in correspondence with the control electrodes 3a, 3b is removed so that the width of the control electrodes 3a, 3b is set to be about 5 μm and the gap between them is set to be about 2 μm, and both control electrodes are designed to be almost perpendicular to the superconducting thin film 2. Though an organic alkaline solution is used as a developing solution for the positive-type photoresist, it does not make contact with the thin film 2 of a high-$T_c$ oxide superconductor which has been covered by the resin thin film 6, so that the superconducting properties are not deteriorated.

Figure 9D:
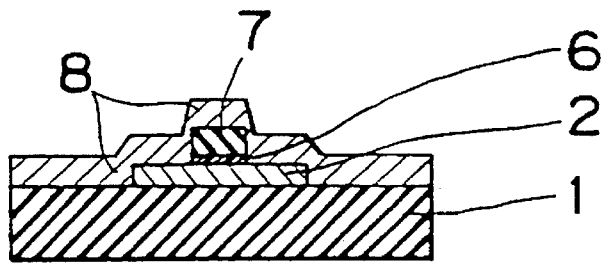

Then, as shown in FIG. 9(d), after the exposed resin thin film 6 is removed by subjecting it to oxygen plasma, aluminum having a thickness of 100 nm is deposited in a vacuum as a metallic thin film 8.

Figure 9E:
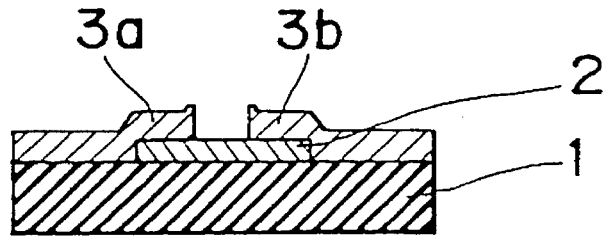

Next, as shown in FIG. 9(e), the photoresist 7 is removed by a lift-off process by immersing it in acetone, and the resin thin film 6 is removed by immersing it in 1, 1, 1-trichloroethane, to form metallic control electrodes 3a, 3b. The distance between the control electrodes 3a and 3b is about 2 μm. Thus, the manufacturing process of the superconducting element is complete.

A superconducting element manufactured as mentioned above has an insulator of aluminum oxide formed at the interface between the control electrodes 3a, 3b and the superconducting thin film 2 of oxide superconductor, so that a tunnel junction is formed between the control electrodes 3a, 3b and the superconducting thin film 2. Further, when a different metal which is liable to be oxidized other than aluminum is used for the control electrodes 3a, 3b, an insulator is also formed at the interface.

On the other hand, when a noble metal such as platinum or gold is used as the material of the control electrodes, an insulator is not formed at the interface and the resistance between the control electrodes 3a, 3b and the superconducting thin film 2 is low. In this case, if an insulating film of MgO or others having a thickness of about 10 nm is formed between the superconducting thin film 2 and the control electrodes 3a, 3b, a superconducting element is obtained having characteristics similar to the above-mentioned superconducting element containing aluminum.

Characteristics of the above-mentioned superconducting elements are similar to each other irrespective of the existence of an insulator at the bridge-electrode interface.

In the case where an insulator film is formed for protection on a superconducting thin film of oxide superconductor, the insulator film cannot be made thick. Thus, a solution is liable to penetrate through pin holes in the insulator film to deteriorate the superconducting thin film. On the contrary, the manufacturing method according to the present invention can prevent the deterioration of the thin film of oxide superconductor. In other words, a resin thin film which has resistance to the developing solution of photoresist can prevent the direct contact of the superconducting thin film with the developing solution, so that the superconducting properties of the oxide superconductor are not deteriorated. Thus, a superconducting element which can be operated at liquid nitrogen temperatures can be manufactured. Furthermore, because the process of forming the superconducting thin film is independent of the process of forming the control electrodes, the optimum conditions can be adopted for each of the two processes, so that the characteristics can be improved and the yield rate can be increased. Still further, a process such as post-annealing can be incorporated in the process for forming the superconducting thin film of the high-$T_c$ oxide superconductor.

Figure 10:
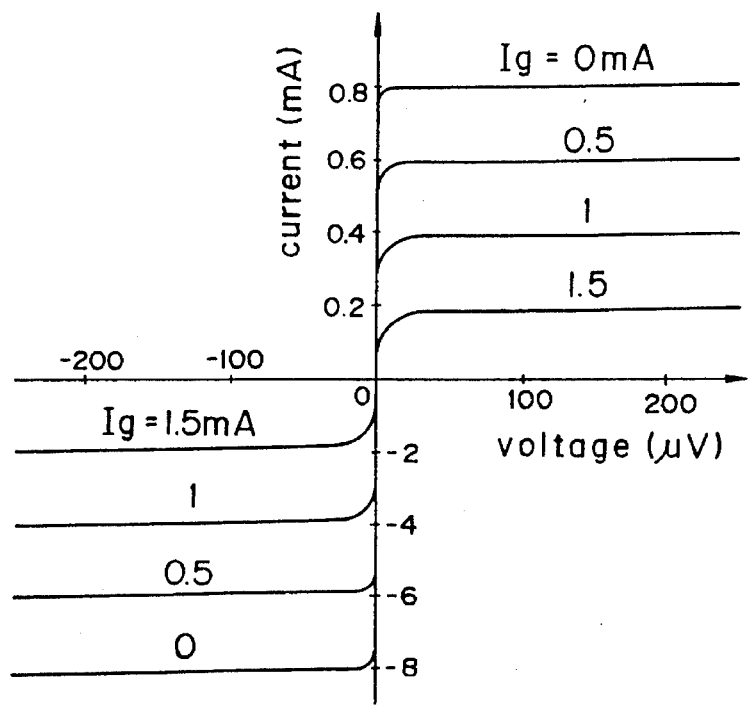
FIG. 10 is a graph of an example of the current-voltage characteristics as a function of the control current of a superconducting element according to the present invention.

The characteristics of a superconducting element manufactured as mentioned above will be explained below. The superconducting element was kept at 77.3° K. in liquid nitrogen. The observed current-voltage characteristics showed indicated that the superconducting critical current flowing in the superconducting thin film 2 was 0.78 mA. When a current from 0 to 1.5 mA is injected from the control electrodes 3a, 3b, the superconducting critical current value varied from 0.78 mA to 80 μA. FIG. 10 shows an example of the current-voltage characteristics as a function of control current $I_g$. This change was continuous and reversible against the injection current of the control electrodes 3a, 3b.

Figure 11:
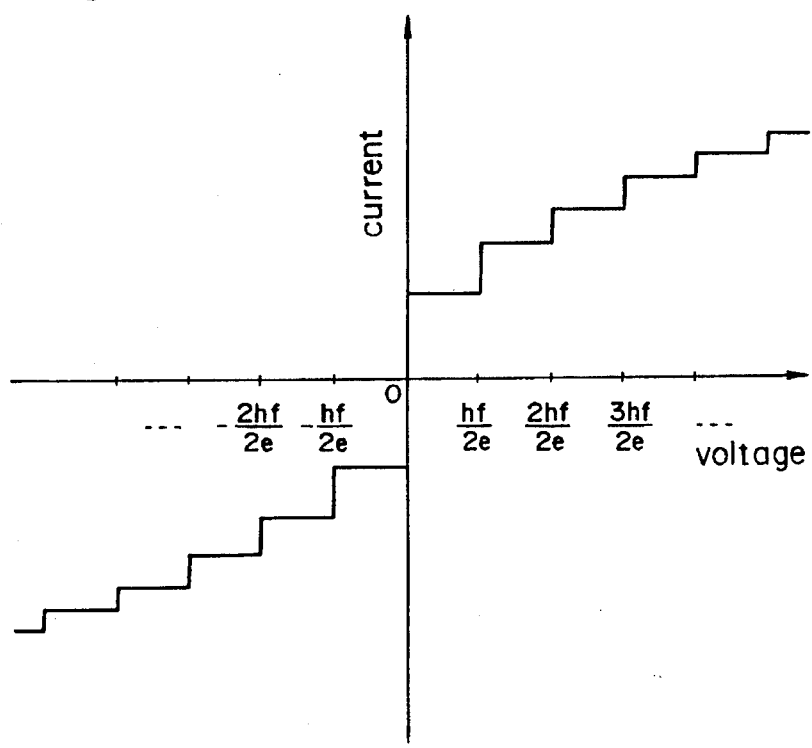
FIG. 11 is a graph of an example of the current-voltage characteristics of the superconducting element shown in FIG. 5 which is irradiated with microwaves.

Next, microwaves at 10 GHz were irradiated to the superconducting element kept in the above-mentioned conditions. The AC Josephson effect was not observed when the control current $I_g$ was small. On the other hand, as shown in FIG. 11, when the control current $I_g$ is 1.2 mA or more, a current step (Shapiro step) was observed at electrical voltages of an integral number times hf/2e=2,068×f (μV) (wherein h is Planck's constant 6.626×10$^{-34}$ J.S, e is the elementary charge 1.602×10$^{-19}$ C, and f is frequency expressed in the unit of GHz), or the AC Josephson effect was confirmed. This shows indicates that a weak-coupling bridge was realized when the control current $I_g$ is 1.2 mA or more.

As for a superconducting element having control electrodes of the structure shown in FIG. 7, the control characteristics similar to those shown in FIG. 10 and the AC Josephson characteristics similar to those shown in FIG. 11 were observed.

An explained above, it was found that the superconducting current can be controlled quickly in response to the injection of the control current and that a weak-coupling bridge can be realized by controlling the control current value.

Next, a second embodiment of a method of manufacturing a superconducting element will be explained below with reference to FIGS. 12(a)–12(b).

Figure 12A:
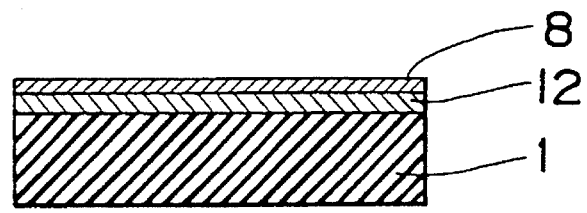
FIGS. 12(a), 12(b), 12(c) and 12(d) are schematic sectional and perspective views which show successive steps of a method of manufacturing a superconducting element according to the present invention.

First, as shown in FIG. 12(a), a superconducting thin film 12 of a high-$T_c$ oxide superconductor material, for example an oxide superconductor containing copper such as Bi—Sr—Ca—Cu—O, having a thickness about 200 nm is deposited on a (001) substrate/surface of MgO single crystal using for example an rf magnetron sputtering process at a substrate 1 temperature of about 670° C. in an argon-oxygen environment. Then, after the substrate 1 is cooled down to about room temperature, aluminum is deposited up to a thickness of about 100 μm without breaking the vacuum using an rf magnetron sputtering process, and gold is deposited further up to a thickness of 50 nm. Thus, a metallic thin film 8 is applied to the superconducting thin film 12. The gold is used to prevent the oxidation of the surface of the metallic thin film 8 in the following process for removing the photoresist by oxygen plasma, but it is not necessarily needed. It is effective to deposit an insulator thin film such as MgO on the superconducting thin film of the oxide superconductor before applying the metallic thin film 8.

Figure 12B:
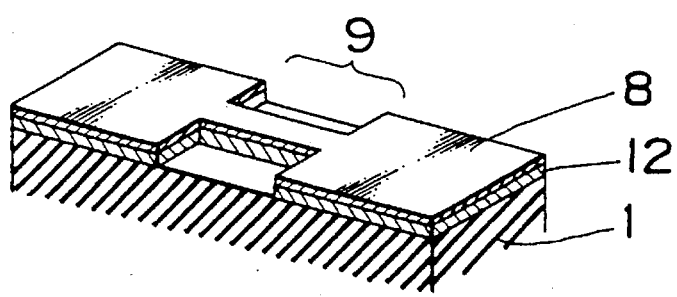

Next, as shown in FIG. 12(b), the substrate 1 is taken out from the vacuum chamber, and the thin film 12 of oxide superconductor and the metallic thin film 8 are both formed to have a width of about 10 μm in the surface direction and a length of about 20 μm to form a bridge 9 using a photolithography process with cyclized rubber negative-type photoresist and an ion-etching process with argon gas. The gas pressure is about 1×10$^{-14}$ Torr and the ion acceleration voltage is about 550 V.

Figure 12C:
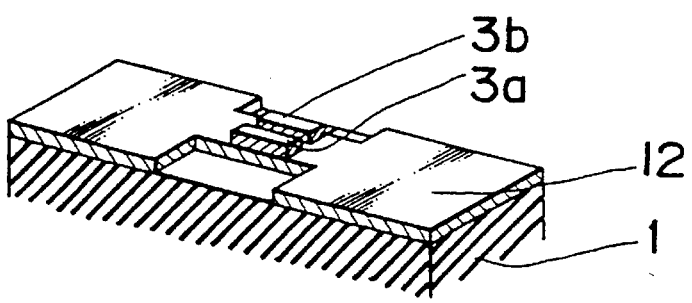

Then, after removing the photoresist by oxygen plasma, as shown in FIG. 12(c), control electrodes 3a and 3b are formed by removing partially the metallic thin film 8 on the bridge 9, by using a similar process of forming the bridge 9. The FIG. 12(c) shows the case of separate control electrodes of FIGS. 1 and 2. The width as shown in the control electrodes is about 10 μm, while the gap between the control electrodes on the superconducting thin film 12 is about 2 μm.

The order of the process of forming the bridge shown in FIG. 12(b) and that of forming the control electrodes shown in FIG. 12(c) can be reversed.

Figure 12D:
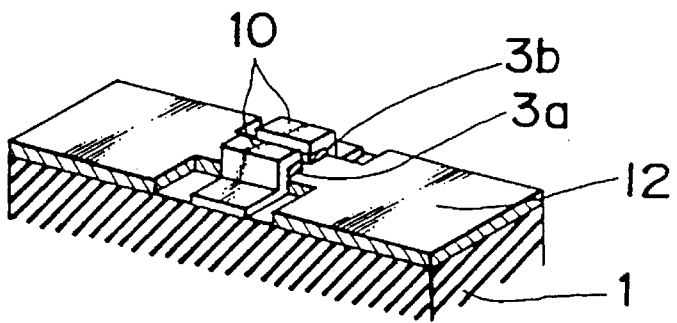

Next, aluminum having a thickness of about 200 nm is deposited on the surface of the exposed control electrodes 3a, 3b of using an rf magnetron sputtering process, and only the unnecessary area is removed using an ion etching technique to form extension electrodes 10, as shown in FIG. 12(d), which are connected electrically to the control electrodes 3a, 3b. Thus, a superconducting element is completed.

Another process of forming the extension electrodes is possible using a lift-off process. That is, a lift-off mask for extension electrodes to be applied on a part of the control electrodes exposed for contact is formed using photolithography with a photoresist, such as a PMMA electronic beam photoresist which uses a olephilic organic solvent, such as ketone, as a developing solution. Then, a thin film for the extension electrodes is deposited using the lift-off mask. Then, lift-off is conducted by immersing the substrate in acetone or the like.

A still different process of forming the extension electrodes will be explained with reference to FIGS. 13(a)–13(d).

Figure 13:
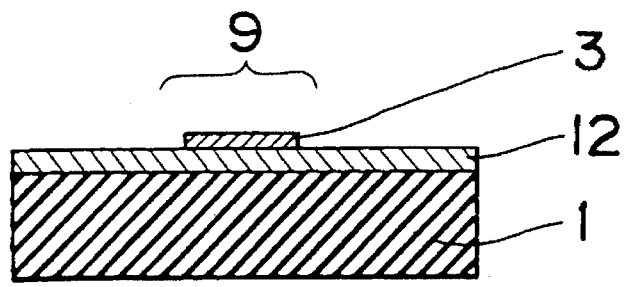
FIGS. 13(a), 13(b), 13(c) and 13(d) are schematic sectional views which show steps of an embodiment of a process of forming extension electrodes in a method of manufacturing a superconducting element according to the present invention.
Figure 13:
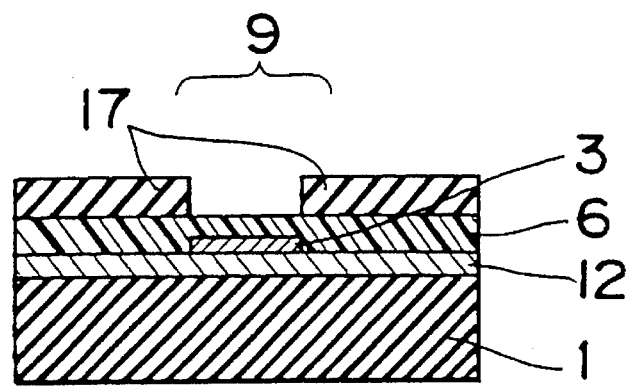
Figure 13:
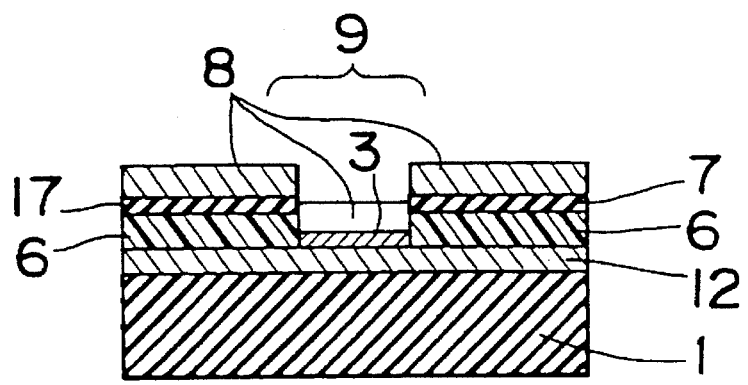
Figure 13:
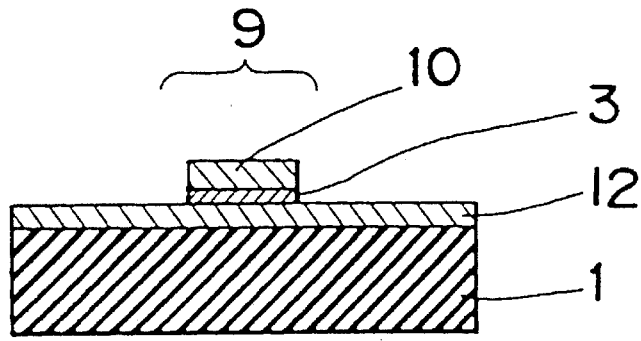

First, as shown in FIG. 13(a), control electrode 3 is formed on the thin film 12 of the oxide superconductor of the bridge 9.

Then, as shown in FIG. 13(b), a resin thin film 6 which has a resistance against a developing solution of photoresist 17 for patterning, such as cresolnovolak naphthoquinonediazide positive-type photoresist, is coated on the substrate with spinning up to a thickness of 700 nm, and then a photoresist for patterning is coated on the resin thin film 6 with spinning up to a thickness a 1 μm. Next, the photoresist 17 is exposed and deposited. The resin thin film 6 does not dissolve in this process because the developing solution used is xylene.

Next, as shown in FIG. 13(c), a part of the positive-type photoresist (resin thin film 6) in correspondence to the extension electrodes is removed using the exposition of the substrate of oxygen plasma or using argon ion trimming to expose a part of the control electrodes.

Then, as shown in FIG. 13(d), the substrate is immersed in an organic solvent such as acetone so that at least one of the resin thin film 6 and the photoresist (resin thin film in this case) is lifted off by swelling and dissolution to form extension electrodes 10.

It is difficult to estimate precisely the deterioration of the thin film 12 of high-$T_c$ oxide superconductor in the manufacturing processes of superconducting element because the metallic thin film 8 is layered. However, the deterioration of characteristics can be estimated from a comparison of those of the a thin film of oxide superconductor not applied to the metallic thin film 8. This shows that the transition temperature and the critical current density are of the same order in both cases. Therefore, we consider that the deterioration of the characteristics is suppressed in the manufacturing process of the superconducting element.

Further, the current-voltage characteristics between one of the control electrodes 3 and the thin film 12 of the oxide superconductor of the superconducting element manufactured as mentioned above depicts a good tunnel barrier effect without hysteresis, fluctuations and drift. Moreover, when a current flows between the control electrode 3 and the superconducting thin film 12, the superconducting current which flows in the superconducting thin film 12 can be suppressed, and the ratio of the suppression of the superconducting current against the control current is as high as about ten to one. That is, it is found that a good element characteristics can be obtained.

A superconducting element manufactured according to a second method mentioned above has better characteristics and is more stable generally when compared with that manufactured according to a first method mentioned above. As to the yield rate, the former is also better than the latter.

The material of the substrate 1 used in the above-mentioned embodiments is MgO, and the material of the superconducting thin film 2, 12 used in the above-mentioned embodiments is for example Bi—Sr—Ca—Cu—O high-$T_c$ superconductor. However, superconducting thin films of other oxide superconductor containing copper, Ba—Pb—Bi—O or Ba—K—Bi—O have similar effects to Bi—Sr—Ca—Cu—O. Thus, the substrate can be selected according to the superconducting material. Further, as to the material for the superconducting thin film, metal containing niobium or lead, alloy or metallic compound can also be used effectively.

Further, the deposition of the superconducting thin film of the oxide superconductor can be conducted using a reactive vacuum deposition process, laser deposition process or the like, as well as the rf magnetron sputtering process.

Moreover, an aluminum film or a double layer film of aluminum and gold can be used for the metallic thin film 8 in the above-mentioned embodiments. However, a similar advantage is observed for a metallic thin film 8 made of other materials such as an alloy material containing aluminum or a layered structure of a metal film containing aluminum deposited on the side of the thin film 12 of oxide superconductor and another metallic film of metallic material of gold, silver, platinum or the like or of alloy material on the other side. Still further, a semiconductor thin film made of silicon or the like can also be used instead of the metallic thin film.

A deposition process other than the rf magnetron sputtering process can be used if it is conducted without disrupting the vacuum in the same vacuum chamber and it is compatible with the process of forming a superconducting thin film. For example, other vacuum deposition processes, an electronic deposition process, an ion bean deposition process or a laser deposition process can be adopted.

The material of the extension electrodes 10 is aluminum in the embodiments. However, any other metal, alloy, semiconductor or superconductor having an ohmic contact with the control electrodes 3 can be used for the extension electrodes 10.

Further, a negative-type photoresist is used in the above-mentioned embodiment for the resin thin film 6 which has resistance to an organic alkaline solution. However, any other resin thin films having resistance to a developing solution of the photoresist of the layer applied above can be used, such as polyimide resin, rubber resin, or PMMA resin.

As explained above, in a second manufacturing method of a superconducting element, a good interface can be formed between the superconducting thin film and the metallic or semiconducting thin film because both are deposited in the same vacuum chamber successively without disrupting the vacuum. The interface is not contaminated in the following processes. Thus, a superconducting element of good characteristics can be manufactured at a high yield rate.

Further, it is found that a good and stable tunnel barrier can be formed naturally between the metallic thin film 8 and the superconducting thin film 12 of the oxide superconductor when a metallic material containing at least aluminum is deposited without disrupting the vacuum as the metallic thin film or at least at the side of layered structure metallic films in contact with the superconducting thin film since the aluminum takes oxygen in the oxide superconductor to form an aluminum oxide film.

Though a part of the surface of the thin film of the oxide superconductor is etched in the process of forming a bridge and control electrodes using an ion etching technique with inert gas, the deterioration of the characteristics of the superconducting thin film of the oxide superconductor can be suppressed to a minimum degree since the etching gas ions are inert.

Further, the tunnel barrier formed naturally at the interface between the thin film of oxide superconductor and the control electrodes is not disturbed and is kept in a good state in the subsequent processes of the manufacturing method since the metallic thin film which will become the control electrodes plays a role of a protection film in the air and in the photolithography process and the processes after the formation of the control electrodes do not use heat treatment at a high temperature.

If the superconducting thin film is made of oxide superconductors, such as those containing copper such as Bi—Sr—Ca—Cu—O or Y—Ba—Cu—O, or Ba—Pb—Bi—O or Ba—K—Bi—O, the superconducting element can be operated at higher temperatures when compared with a superconducting element having a superconducting thin film made of a low-$T_c$ superconductor such as niobium.

The extension electrodes are formed after the control electrodes are formed, so that both are connected electrically through an ohmic junction, such as metal-metal junction or metal-metaloxide junction. Therefore, the process of forming a tunnel barrier of the control electrodes can be separated from the metalization process, and the conditions of the processes can be optimized easily.

In the process of forming extension electrodes, a thin film deposited for forming extension electrodes or a resin thin film having a resistance to a developing solution of a photoresist plays the role of a protection film in the photoprocess, that is, it prevents the exposed surface of the superconducting thin film of oxide superconductor from making contact with water, acidic or basic aqueous solution or organic solvent. Thus, the deterioration of the characteristics of the thin film of oxide superconductor can be minimized. Moreover, if a photoresist uses a olephilic organic solvent, the exposed thin film of oxide superconductor does not dissolve in the developing solution after the deposition. Thus, the derioration of the characteristics of the thin film can also be minimized.

In conclusion, a superconducting element having stable and desirable characteristics can be manufactured reproducibly, and the yield rate can be improved so as to lower the cost. Further, a superconducting element having a high efficiency and stable characteristics can be manufactured because the interface between the control electrodes and the thin film of oxide superconductor is kept clean and the ratio of the appearance of interface levels is small due to the continuous formation of both layers in the vacuum chamber without breaking the vacuum.

It is understood that various other modifications will be apparent to and can be readily made by those skilled in the art without departing from the scope and spirit of the present invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

What is claimed is:

1. A superconducting element comprising:

a substrate having a surface;

a superconducting thin film extending lengthwise along the surface of said substrate in a first direction, the first direction coinciding with a superconducting current flow of said superconducting thin film, said superconducting thin film having opposite first and second side edge portions which define an intersection region within the superconducting thin film therebetween, the intersection region extending widthwise in a second direction which is substantially perpendicular to the first direction from the first side edge portion to the second side edge portion of the superconducting thin film;

control electrode means, made of a nonsuperconductor material and located along a first surface portion of the intersection region of the superconducting thin film and terminating at a remaining second surface portion of the intersection region, for selectively varying a superconducting current path in the second direction of the superconducting thin film by injecting quasiparticles into the first surface portion of the intersection region of said superconducting thin film, wherein a portion of the intersection region located below the remaining second surface portion is a weak-coupling bridge region in which the superconducting current flow in said superconducting thin film is variably controlled responsive to said control electrode means.

2. A superconducting element as recited in claim 1, wherein said control electrode means includes a single electrode extending along the first surface portion of the intersection region of said superconducting thin film into which the quasiparticles are injected and terminating at the remaining second surface portion of the intersection region of said superconducting thin film.

3. A superconducting element as recited in claim 1, wherein the first surface portion of the intersection region of said superconducting thin film into which the quasiparticles are injected is comprised of two spaced apart opposite surface portions, and wherein the remaining second surface portion of the intersection region is located between the two spaced apart opposite surface portions, and wherein said control electrode means includes first and second electrodes respectively extending along the two spaced apart opposite surface portions of the intersection region and terminating at the remaining second surface portion of the intersection region.

4. A superconducting element as recited in claim 1, wherein said control electrode means includes an electrode member extending along the first surface portion of the intersection region of said superconducting thin film into which the quasiparticles are injected and terminating at the remaining second surface portion of the intersection region, wherein the electrode member includes first and second electrodes and a connecting electrode coupling the first and second electrodes, wherein the connecting electrode is relatively smaller in the first direction than the first and second electrodes, and wherein the remaining second surface portion of the intersection region is comprised of two spaced apart surface portions having the connecting electrode disposed therebetween.

5. A superconducting element as recited in claim 1, further comprising an insulating thin film located between said superconducting thin film and said control electrode means.

6. A superconducting element as recited in any one of claims 1 to 5, wherein said superconducting thin film is made of at least one of niobium, lead, and aluminum.

7. A superconducting element as recited in any one of claims 1 to 5, wherein said superconducting thin film is made of a high-$T_c$ oxide superconductor.

8. A superconducting element as recited in claim 4, wherein the high-$T_c$ oxide superconductor includes copper atoms.

9. A superconducting element as recited in claim 8, wherein the high-$T_c$ oxide superconductor is Bi—Sr—Ca—Cu—O.

10. A superconducting element as recited in claim 7, wherein the high-$T_c$ oxide superconductor is one of Ba—Pb—Bi—O and Ba—K—Bi—O.

11. A superconducting element according to claim 7, wherein said control electrode means is at least partially in direct contact with the high-$T_c$ oxide superconductor and is made of aluminum.

* * * * *